(12) United States Patent
Maeda et al.

(10) Patent No.: US 10,854,465 B2
(45) Date of Patent: *Dec. 1, 2020

(54) METHOD OF FABRICATING PATTERN STRUCTURE

(71) Applicant: Samsung Electronics Co., Ltd., Suwon-si (KR)

(72) Inventors: Shigenobu Maeda, Seongnam-si (KR); Jeong Ju Park, Hwaseong-si (KR); Eunsung Kim, Seoul (KR); Hyunwoo Kim, Seongnam-si (KR); Shiyong Yi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/023,836

(22) Filed: Jun. 29, 2018

(65) Prior Publication Data

US 2018/0308705 A1     Oct. 25, 2018

Related U.S. Application Data

(62) Division of application No. 15/099,945, filed on Apr. 15, 2016, now Pat. No. 10,032,638.

(30) Foreign Application Priority Data

May 19, 2015   (KR) .......................... 10-2015-0069584

(51) Int. Cl.
*H01L 21/308*  (2006.01)
*H01L 21/311*  (2006.01)
*H01L 21/3213* (2006.01)
*H01L 21/033*  (2006.01)

(52) U.S. Cl.
CPC ...... *H01L 21/3086* (2013.01); *H01L 21/0337* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | |
|---|---|---|
| 7,923,373 B2 | 4/2011 | Sandhu |
| 8,071,484 B2 | 12/2011 | Kim et al. |
| 8,114,306 B2 | 2/2012 | Cheng et al. |
| 8,263,323 B2 | 9/2012 | Yoon et al. |
| 8,334,089 B2 | 12/2012 | Yi et al. |
| 8,821,978 B2 | 9/2014 | Cheng et al. |
| 8,853,101 B1 | 10/2014 | Farrell et al. |
| 9,576,817 B1 | 2/2017 | Cheng et al. |

(Continued)

*Primary Examiner* — Thien F Tran
(74) *Attorney, Agent, or Firm* — Harness, Dickey & Pierce, P.L.C.

(57) ABSTRACT

A method includes forming mask patterns spaced apart from each other by at least one opening on an etch target layer, filling the opening with a block copolymer material including first and second polymer blocks of different properties, and annealing the block copolymer material to form first patterns and second patterns, the first patterns in contact with facing sidewalls of adjacent ones of the mask patterns, respectively, and at least one of the second patterns between the first patterns. The first patterns include the first polymer blocks and the second patterns include the second polymer blocks.

20 Claims, 20 Drawing Sheets

(56) References Cited

U.S. PATENT DOCUMENTS

| | | |
|---|---|---|
| 10,032,638 B2 * | 7/2018 | Maeda .............. H01L 21/32139 |
| 2007/0224823 A1 | 9/2007 | Sandhu |
| 2008/0299774 A1 | 12/2008 | Sandhu |
| 2008/0305636 A1 | 12/2008 | Kim et al. |
| 2010/0167214 A1 | 7/2010 | Yoon et al. |
| 2010/0297847 A1 | 11/2010 | Cheng et al. |
| 2011/0147983 A1 | 6/2011 | Cheng et al. |
| 2012/0015527 A1 | 1/2012 | Yi et al. |
| 2014/0065839 A1 | 3/2014 | Kawanishi et al. |
| 2014/0138801 A1 | 5/2014 | Tsai et al. |
| 2014/0273511 A1 | 9/2014 | Farrell et al. |
| 2014/0287587 A1 | 9/2014 | Lee et al. |
| 2014/0370712 A1 | 12/2014 | Kim et al. |
| 2014/0377956 A1 | 12/2014 | Nakajima et al. |
| 2015/0021295 A1 | 1/2015 | Yoshikawa et al. |
| 2015/0050794 A1 | 2/2015 | Kim et al. |
| 2016/0358776 A1 | 12/2016 | Guillorn et al. |

* cited by examiner

Homogeneous

Self-assembled

METHOD OF FABRICATING PATTERN STRUCTURE

CROSS-REFERENCE TO RELATED APPLICATIONS

This is a divisional of U.S. non-provisional application Ser. No. 15/099,945, filed on Apr. 15, 2016, which claims priority under 35 USC § 119 to Korean Patent Application No. 10-2015-0069584, filed on May 19, 2015, the entirety of each of which is hereby incorporated by reference.

BACKGROUND

1. Field

Some example embodiments of the present disclosure relate to methods of fabricating a pattern structure and/or to methods of fabricating a pattern structure with improved reliability and integration density.

2. Description of the Related Art

Due to their smaller size, multifunctionality, and/or relatively low-cost characteristics, semiconductor devices have been used in the electronics industry. However, integration density of semiconductor devices continues to increase with the advance in the electronics industry, which results in various problems. For example, due to increased integration density of a semiconductor device, width and/or spaced distance of patterns in the semiconductor device decreases while height and/or aspect ratio of the patterns increases. Accordingly, distribution of a deposition process and/or an etch process of thin films are deteriorated, thereby decreasing reliability of the semiconductor device.

SUMMARY

Some example embodiments of the present disclosure relate to methods of fabricating a relatively highly integrated pattern structure with improved reliability.

According to some example embodiments of the inventive concepts, a method of fabricating a pattern structure includes forming mask patterns on an etch target layer, the mask patterns spaced apart from each other by at least one opening, filling the opening with a block copolymer material including first and second polymer blocks of different properties, and annealing the block copolymer material to form first patterns and second patterns, the first patterns in contact with facing sidewalls of adjacent ones of the mask patterns, respectively, and at least one of the second patterns between the first patterns, the first patterns including the first polymer blocks and the second patterns including the second polymer blocks.

In some example embodiments, a width of the opening may be smaller than or equal to a length of a unit of a block sequence in the block copolymer material, the block sequence including the first polymer block-the second polymer block-the second polymer block-the first polymer block.

In some example embodiments, the first polymer block-the second polymer block-the second polymer block-the first polymer block may be arranged sequentially from one of the facing sidewalls of the adjacent mask patterns to another of the facing sidewalls of the adjacent mask patterns in a horizontal direction.

In some example embodiments, each of the mask patterns may be hydrophobic, each of the first patterns may be hydrophobic, and the second patterns may be hydrophilic.

In some example embodiments, the block copolymer material may include polystyrene-block-polymethylmethacrylate (PS-b-PMMA), the first polymer block may include polystyrene (PS), and the second polymer block may include polymethylmethacrylate (PMMA).

In some example embodiments, the method may further include selectively removing the second patterns, and etching the etch target layer using the first patterns and the mask patterns as etch masks to form the pattern structure.

In some example embodiments, the block copolymer material may include polystyrene-block-polydimethylsiloxane (PS-b-PDMS), the second polymer block may include polystyrene (PS), and the second polymer block may include polydimethylsiloxane (PDMS).

In some example embodiments, the method may further include forming a neutral layer on the block copolymer material and the mask patterns before annealing the block copolymer material.

In some example embodiments, the method may further include removing the first patterns and the mask patterns, and etching the etch target layer using the second patterns as an etch mask to form the pattern structure.

In some example embodiments, each of the mask patterns may extend in one direction, widths of the mask patterns may be equal to each other, and the opening may include a first opening having a first width and a second opening having a second width smaller than the first width.

In some example embodiments, the first width may be equal to a length of the unit of a block sequence in the block copolymer material, the block sequence including the first polymer block-the second polymer block-the second polymer block-the first polymer block in the block copolymer block.

In some example embodiments, surfaces of the mask patterns are hydrophilic, and the method may further include hydrophobically modifying surfaces the hydrophilic surfaces of the mask patterns.

In some example embodiments, each of the first patterns may be hydrophobic, and the second patterns may be hydrophilic.

According to other example embodiments of inventive concepts, a method of fabricating a pattern structure includes forming a mask layer on an etch target layer, forming a sacrificial pattern on the mask layer extending in a first direction, the sacrificial pattern having a linear structure of a first width, forming spacers on sidewalls of the sacrificial pattern to define a first opening exposing a top surface of the mask layer, the first opening having a second width different from the first width, removing the sacrificial pattern to form a second opening having the first width, etching the mask layer using the spacers as etch masks to form mask patterns, the mask patterns defining a third opening having the first width and a fourth opening having the second width, filling each of the third and fourth openings with a block copolymer material including first and second polymer blocks of different properties, and annealing the block copolymer material to form first patterns and second patterns, the first patterns in contact with facing sidewalls of adjacent ones of the mask patterns, respectively, and at least one of the second patterns between the first patterns, the first patterns including the first polymer blocks and the second patterns including the second polymer blocks.

According to yet other example embodiments, a method includes forming a block copolymer layer between adjacent mask patterns, the block copolymer layer including first polymer blocks and second polymer blocks different from the first polymer blocks, and annealing the block copolymer layer in order to form first polymer block patterns and at least one second polymer block pattern, the first polymer block patterns at respective sidewalls of the adjacent mask patterns and the second polymer block pattern between the first polymer block patterns, the first polymer block patterns including the first polymer blocks and the second polymer block pattern including the second polymer blocks.

In yet other example embodiments, the block copolymer layer may be formed in a trench between the adjacent mask patterns, and the trench may have a width that is smaller than or equal to a length of a unit of a block sequence of the block copolymer layers, the block sequence including the first polymer block-the second polymer block-the second polymer block-the first polymer block.

In yet other example embodiments, the first polymer block-the second polymer block-the second polymer block-the first polymer block of the block sequence are arranged sequentially from one of the sidewalls of the adjacent mask patterns to another of the sidewalls of the adjacent mask patterns in a horizontal direction.

In yet other example embodiments, the method may further include forming the mask patterns on an etch target layer, selectively removing the second polymer block pattern after the annealing, and etching the etch target layer using the first polymer block patterns and the mask patterns as etch masks to form the pattern structure.

In yet other example embodiments, the method may further include forming the mask patterns on an etch target layer, removing the first polymer block patterns and the mask patterns after the annealing, and etching the etch target layer using the second polymer block pattern as an etch mask to form the pattern structure.

In yet other example embodiments, the method may further include forming a neutral layer on the block copolymer layer and the mask patterns before the annealing.

BRIEF DESCRIPTION OF THE DRAWINGS

Some example embodiments of inventive concepts will become more apparent in view of the attached drawings and accompanying detailed description. The example embodiments depicted therein are provided by way of example, not by way of limitation, wherein like reference numerals refer to the same or similar elements. The drawings are not necessarily to scale, emphasis instead being placed upon illustrating aspects of some of the example embodiments of the inventive concepts.

DETAILED DESCRIPTION

Figure 1:
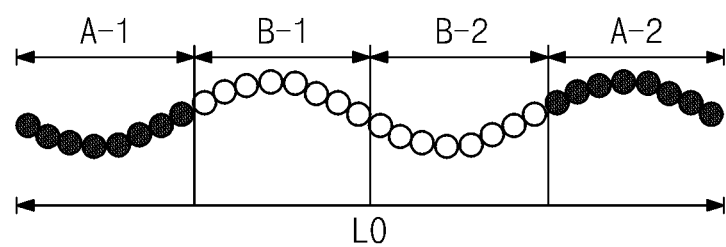
FIG. 1, FIGS. 2A and 2B, and FIG. 3 illustrate a block copolymer.

The advantages and features of the example embodiments of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Example embodiments will be described below with reference to cross-sectional views, which are example drawings of the inventive concepts. The example drawings may be modified by manufacturing techniques and/or tolerances. Accordingly, the example embodiments are not limited to specific configurations shown in the example drawings, and include modifications based on the example method of manufacturing the semiconductor device. For example, an etched region shown at a right angle may be formed in a rounded shape or formed to have a given (or alternatively, predetermined) curvature. Therefore, regions shown in the drawings have schematic characteristics. In addition, the shapes of the regions shown in the example drawings exemplify specific shapes of regions in an element, and do not limit the inventive concepts. Though terms like a first, a second, and a third are used to describe various elements in various example embodiments of the inventive concepts, the elements are not limited to these terms. These terms are used only to tell one element from another element. An example embodiment described and exemplified herein includes a complementary embodiment thereof.

The terms used in the specification are for the purpose of describing particular embodiments only and are not intended to be limiting of the inventive concepts. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional views of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments of the inventive concepts will now be described more fully with reference to accompanying example drawings.

FIG. 1, FIGS. 2A and 2B, and FIG. 3 illustrate a block copolymer.

Referring to FIG. 1, a block copolymer is a polymer including two or more polymer blocks connected to each other through a covalent bond. For example, the block copolymer may include a first polymer block and a second polymer block that may comprise different monomers and have different chemical properties. For example, the first polymer block may be hydrophilic while the second polymer block may be hydrophobic.

Hereinafter, a block sequence of a first polymer block (A-1)-a second polymer block (B-1)-a second polymer block (B-2)-a first polymer block (A-2) will be defined as a single unit. The length of the single unit will be referred to as unit length L0 of a block copolymer. Within the unit length L0 of the block copolymer, a single first polymer block unit (A-1) and a single second polymer block (B-1) may be covalently bonded to each other, a second polymer block (B-2) having the same chemical properties as the second polymer block (B-1) may be bonded to the side of the second polymer block (B-1), and a first polymer block (A-2) may be covalently bonded to the side of the second polymer block (B-2).

Figure 2A:
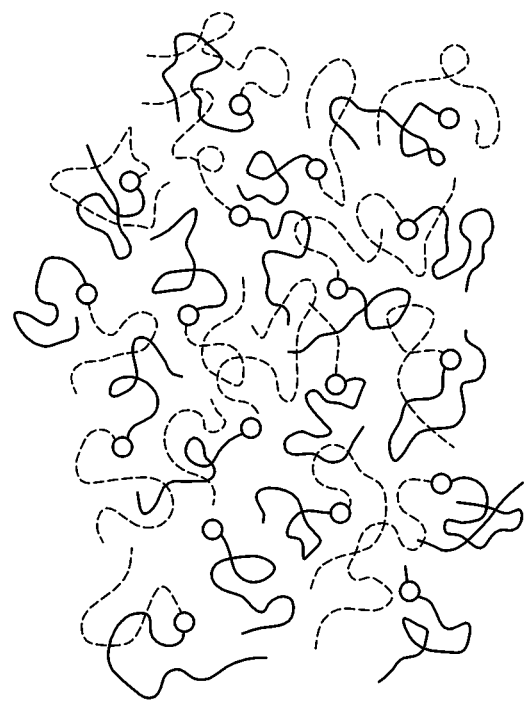
Figure 2B:
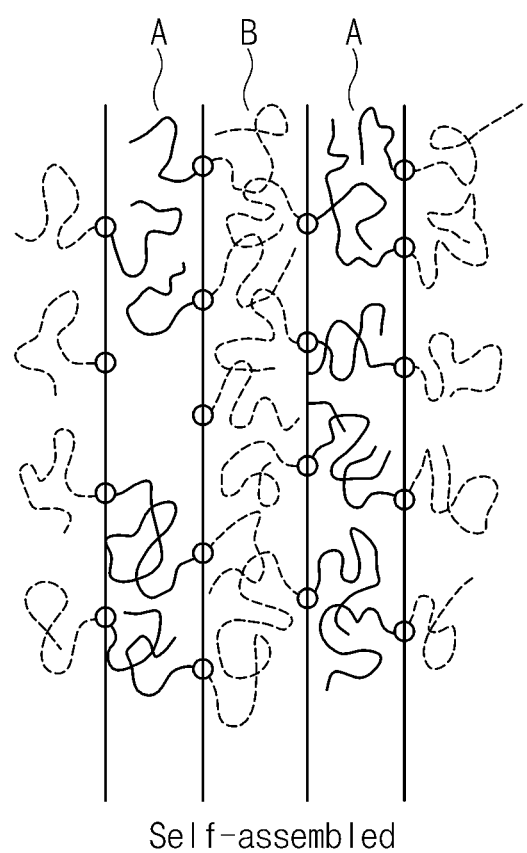

Referring to FIG. 2A, the block copolymer may be a state in which the first and second polymer blocks are mixed disorderly. Referring to FIG. 2B, when the block copolymer is annealed, the annealed block copolymer may be self-assembled to first block parts (A) including the first polymer block and second block parts including the second polymer block (B).

Figure 3:
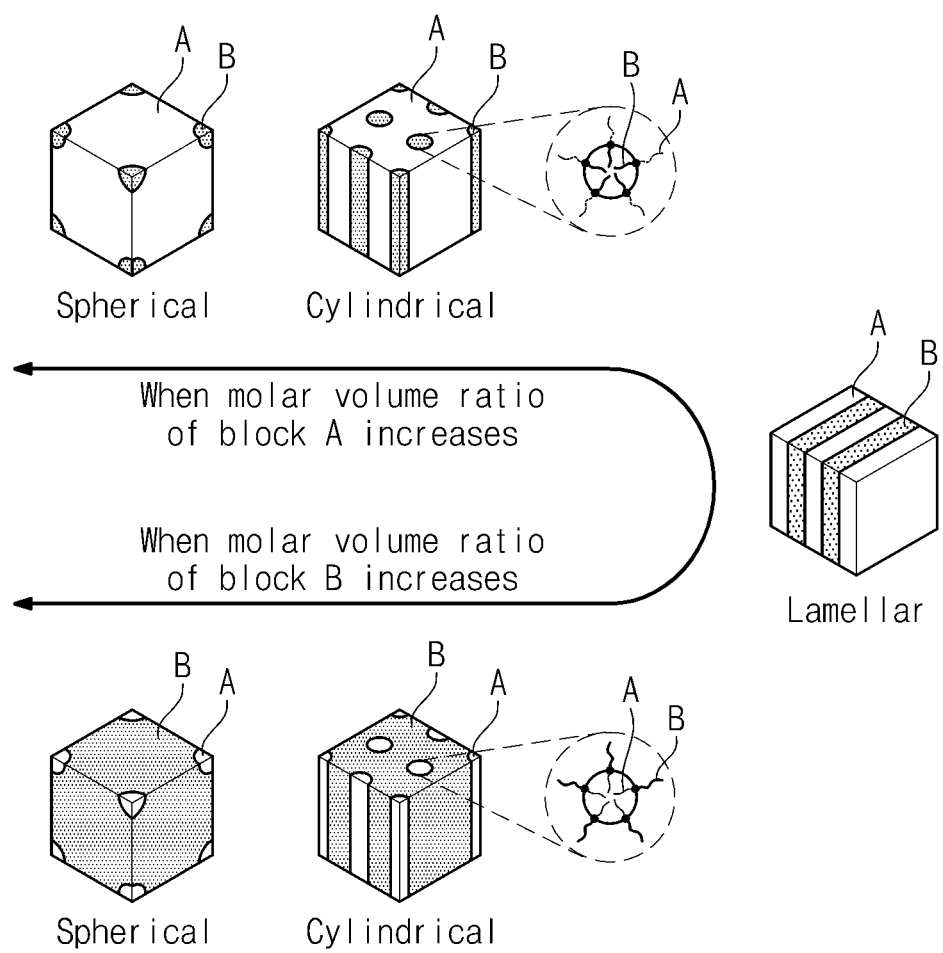

Referring to FIG. 3, the first and second polymer blocks (A and B) may be self-assembled to a spherical, cylindrical or lamellar structure according to a molar volume ratio between the first and second polymer blocks (A and B). For example, when the first polymer block (A) and the second polymer block (B) have a similar molar volume ratio, the first polymer block (A) and the second polymer block (B) may be sequentially stacked to form a lamellar structure that is a layered structure.

When the molar volume ratio of the second polymer block (B) increases, the first polymer block (A) may form a regularly arranged cylindrical structure and the second polymer block (B) may form a matrix structure to cover the cylindrical structure.

When the molar volume ratio of the second polymer block (B) further increases, the first polymer block (A) may form a regularly arranged spherical structure and the second polymer block (B) may form a matrix structure to cover the spherical structure. A reverse phenomenon may occur as the molar volume ratio of the first polymer block (A) increases.

Example embodiments of inventive concepts are aimed to fabricate a pattern structure having a width greater than a critical dimension (CD) that may be implemented in a photolithography process or a double pattern technology (DPT) process using properties of a copolymer forming a lamellar structure.

FIGS. 4 to 8 are cross-sectional views illustrating a method of fabricate a pattern structure according to some example embodiments of inventive concepts.

Figure 4:
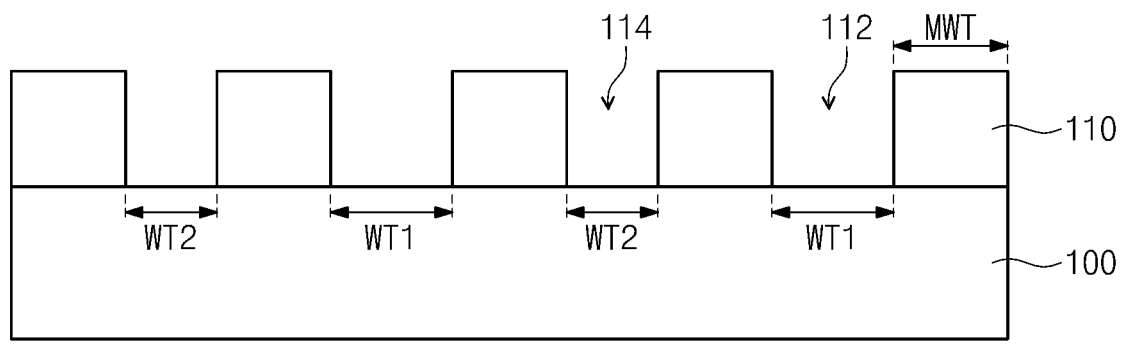
FIGS. 4 to 8 are cross-sectional views illustrating a method of fabricating a pattern structure according to some example embodiments of inventive concepts.

Referring to FIG. 4, mask patterns 110 may be formed on an etch target layer 100.

The mask patterns 110 may include a material having an etch selectivity with respect to the etch target layer 100.

According to an aspect, the etch target layer 100 may include one of a semiconductor material, a conductive material, and an insulating material or a combination thereof. In some example embodiments, if the etch target layer 100 includes the semiconductor material, the etch target layer 100 may be a semiconductor substrate or an epitaxial layer. Alternatively, the etch target layer 100 may include crystalline silicon, amorphous silicon, doped silicon, silicon germanium or a carbon-based material. In some example embodiments, if the etch target layer 100 includes the conductive material, the etch target layer 100 may include doped polysilicon, metal silicide, metal, metal nitride or a combination thereof. In some example embodiments, if the etch target layer 100 includes the insulating material, the etch target layer 100 may include silicon oxide, silicon nitride, silicon oxynitride or a low-k dielectric material.

The mask patterns 110 may include a plurality of openings 112 and 114 to expose a top surface of the etch target layer 100. In some example embodiments, each of the mask patterns 110 may have a line structure extending in one direction and the mask patterns 110 may be parallel to each other. The mask patterns 110 may have substantially the same width MWT.

Spaced distances between the mask patterns 110 may be substantially equal to each other. Alternatively, the spaced distances between the mask patterns 110 may be different from each other. That is, widths of the openings 112 and 114 may be substantially equal to each other or substantially different from each other. In FIG. 4, the widths of the openings 112 and 114 are different from each other. In addition, a width of each of the openings 112 and 114 may be smaller than or substantially equal to the unit length L0 of the block copolymer in FIG. 1. Specifically, the openings 112 and 114 may include a first opening 112 having a first width WT1 and a second opening 114 having a second width WT2 smaller than the first width WT1. The first width WT1 may be substantially equal to the unit length L0 of the block copolymer in FIG. 1.

The mask patterns 110 may include one of carbon-based spin on hardmask (C-SOH) and silicon-based SOH (Si-SOH). In this case, the mask patterns may have a hydrophobic surface.

Figure 5:
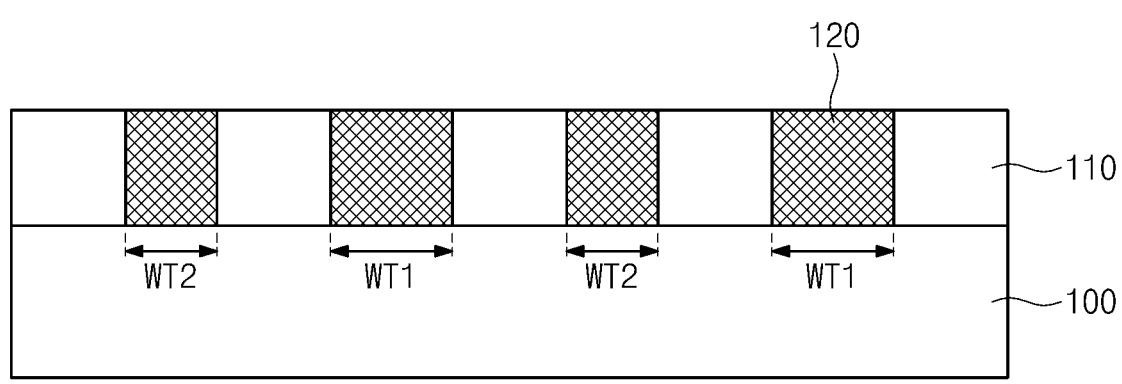

Referring to FIG. 5, the openings 112 and 114 may be filled with a block copolymer material 120 on the etch target layer 110.

The block copolymer material 120 may include at least one selected from the group consisting of polystyrene-block-polymethylmethacrylate (PS-b-PMMA), polystyrene-block-polydimethylsiloxane (PS-b-PDMS), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene.

According to some example embodiments of inventive concepts, the block copolymer material 120 is not limited to the above-mentioned materials.

After one of the above-mentioned materials is selected, i.e., a selected block copolymer material 120 is dissolved in solvent, a block polymer layer is formed by means of spin coating, etc. The solvent may be almost vaporized after the spin coating.

According to example embodiments, the block copolymer material 120 may be PS-b-PMMA. In this case, a molar volume ratio between polystyrene (PS) and poly-methyl-meta-acrylate (PMMA) may be 4:6 or 6:4. The unit length L0 of a block copolymer of the PS-b-PMMA (see FIG. 1) may be about 30 nm.

Figure 6:
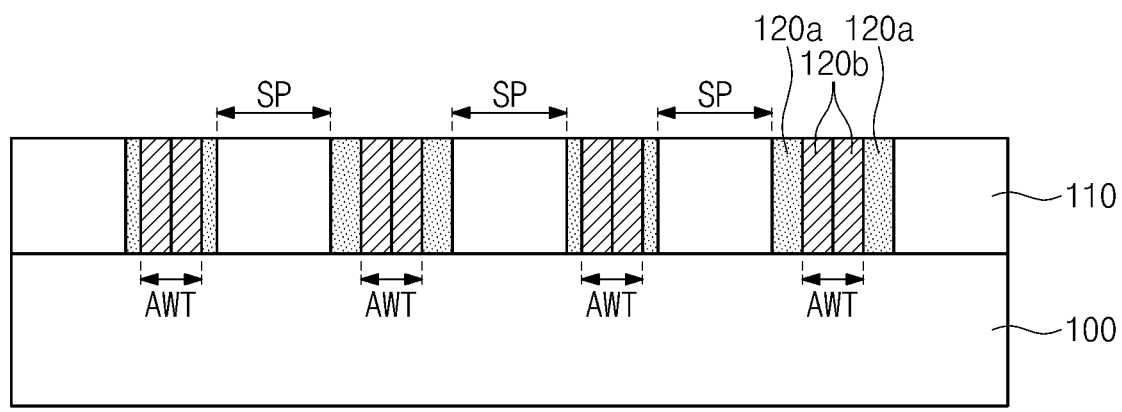

Referring to FIG. 6, the block copolymer material 120 may be self-assembled to first block patterns 120a including first polymer blocks and second patterns 120b including second polymer blocks by annealing the block copolymer material 120. The annealing may include one of solvent annealing, ultraviolet annealing, and thermal annealing.

When the block copolymer material 120 is PS-b-PMMA, each of the first patterns 120 may include PS (hydrophobic) and each of the second patterns 120b may include PMMA (hydrophilic). Thus, the first patterns 120a may be disposed at a side surface of the hydrophobic mask patterns 110. A second pattern 120b may be disposed closely adjacent to the respective first patterns 120a.

As set forth above, the openings 112 and 114 may include the first opening 112 having substantially the same width as the unit length L0 of the block copolymer and the second opening 114 having a second width WT2 smaller than the first width WT1. As shown in FIG. 6, first pattern 120a- second pattern 120b-second pattern 120b-first pattern 120a may be arranged horizontally in the first opening 112. The total horizontal length of the first pattern 120a-the second pattern 120b-the second pattern 120b-the first pattern 120a may be substantially equal to the unit length L0 of the block copolymer (see FIG. 1). The first polymer blocks may be vertically opposite to each other in the respective first patterns 120a, and the second polymer blocks may be vertically opposite to each other in the respective second patterns 120b.

The first pattern 120a-the second pattern 120b-the second pattern 120b-the first pattern 120a may also be arranged horizontally in the first opening 112. Although the first pattern 120a-the second pattern 120b-the second pattern 120b-the first pattern 120a arranged in the first opening 112 are a single unit of a block copolymer, their total horizontal length may be smaller than the unit length L0 of the block copolymer. In this case, PS of the first pattern 120a may be shrunk as a polymer and a block copolymer corresponding to the unit length L0 of the block copolymer may be arranged even within a width smaller than the unit length L0 of the block copolymer.

As shown in FIG. 6, the second patterns 120b disposed in the first and second openings 112 and 114 having different widths WT1 and WT2 may have substantially the same width AWT. Spaced distances between the second patterns 120b may also be substantially equal to each other.

When the surfaces of the mask patterns 110 are modified to be hydrophilic, the first patterns 120a cannot be arranged on sidewalls of the mask patterns 110. Thus, the surfaces of the mask patterns 110 may be made hydrophobic.

In some example embodiments, a material having a —OH group such as PS-OH and 2-hydroxyethyl methacrylate (HEMA) may be provided to the surfaces of the mask patterns 110 to form a PS-brush layer (not shown) on a hydrophilic surface through $CO_2H$ or Si—OH bond. The first patterns 120a including PS may be arranged on the hydrophilic surfaces of the mask patterns 110 by the PS-brush layer.

The PS-OH is represented by Formula (1), and the HEMA is represented by Formula (2).

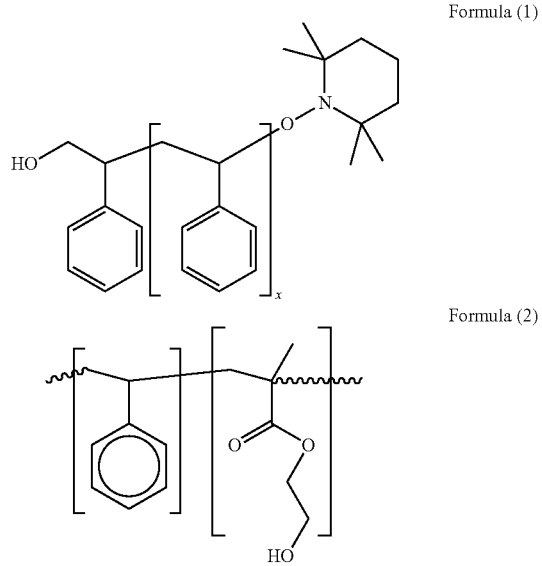

Formula (1)

Formula (2)

Figure 7:
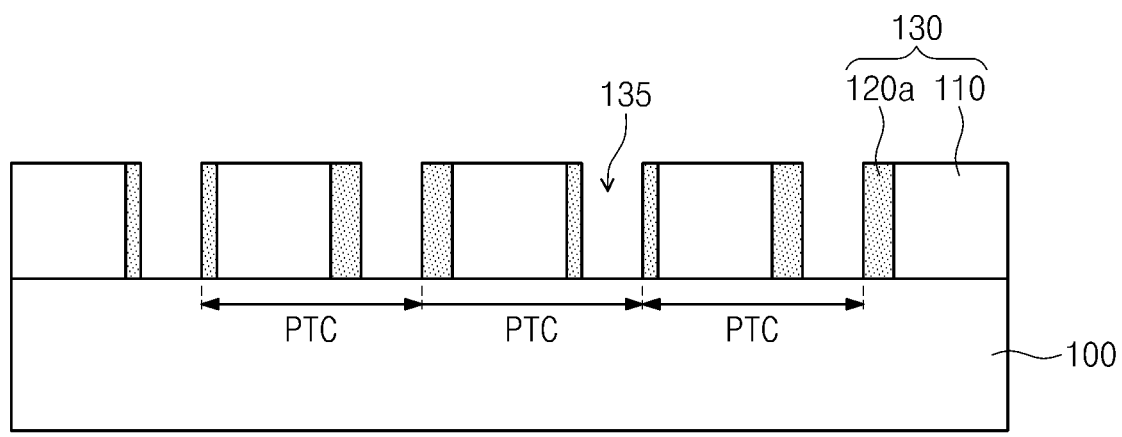

Referring to FIG. 7, the second patterns 120b may be selectively removed to form etch patterns 130 including the mask patterns 110 and the first patterns 120a. Third openings 135 defined by the etch patterns 130 may be formed by means of a process of removing the second patterns 120b.

According to an aspect, the sum of widths of a single etch pattern 130 and a single third opening 135 is called a pitch PTC. Pitches PTC may be substantially equal to each other.

In some example embodiments, when the first pattern 120a includes PS and the second patterns 120b includes PMMA, the second patterns 120b may be removed by means of a dry etch process using oxygen ($O_2$). In some example embodiments, after irradiating deep ultraviolet (UV) to the second pattern 120b, the second patterns 120b may be developed with isopropyl alcohol (IPA) or an acetone-based material to be removed.

Figure 8:
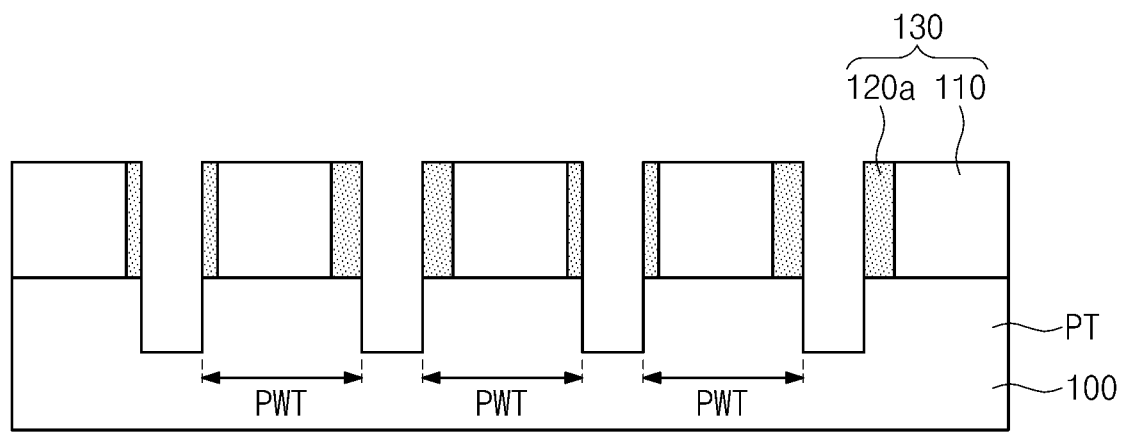

Referring to FIG. 8, the etch target layer 100 may be etched using the etch patterns 130 as etch masks to fabricate a desired pattern structure.

The pattern structure may include a plurality of patterns PT, widths PWT of the patterns PT may be substantially equal to each other, and spaced distances between the patterns PT may be substantially equal to each other.

FIGS. 9 to 13 are cross-sectional views illustrating a method of fabricating a pattern structure according to some example embodiments of inventive concepts.

Figure 9:
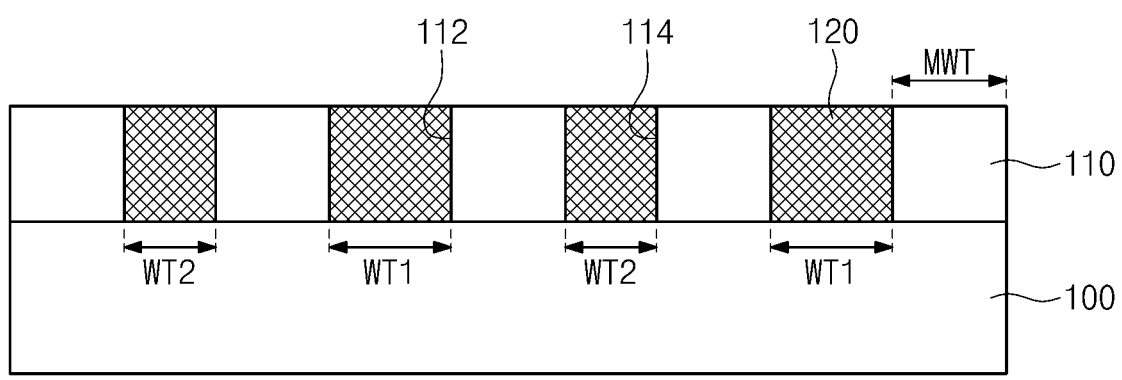
FIGS. 9 to 13 are cross-sectional views illustrating a method of fabricating a pattern structure according to some example embodiments of inventive concepts.

Referring to FIG. 9, openings 112 and 114 defined by mask patterns 110 formed on an etch target layer 100 may be filled with a block copolymer material 120. The step of forming the mask patterns 110 on the etch target layer 100 is substantially identical to that described with reference to FIG. 4 and will not be described in further detail.

In the example embodiments, the block copolymer material 120 may be polystyrene-block-polydimethylsiloxane (PS-b-PDMS). In this case, a molar volume ratio between polystyrene (PS) and polydimethylsiloxane (PDMS) may be 4:6 or 6:4. The unit length L0 of the block copolymer of the PS-b-PDMS (see FIG. 1) may be about 30 nm.

Figure 10:
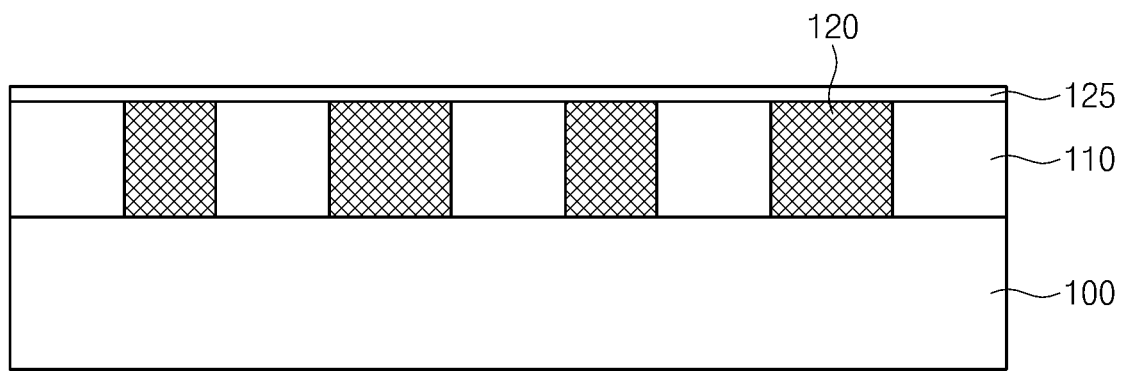

Referring to FIG. 10, a neutral layer 125 may be formed on the mask patterns 110 filled with the block copolymer material 120.

Figure 11:
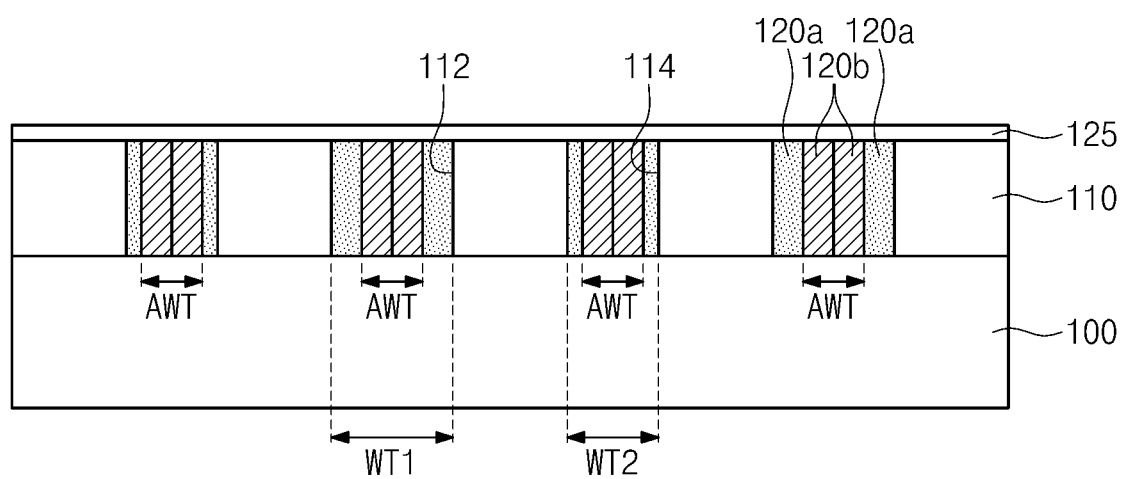

Due to properties of the PS-b-PDMS, during a subsequent annealing process, it may be difficult to achieve vertically opposite arrangement of first polymer blocks in the respective first patterns 120a (see FIG. 11) and to achieve vertically opposite arrangement of second polymer bocks in the respective second patterns 120b (see FIG. 11). Accordingly, it may be easy to achieve vertically opposite arrangement of the first polymer blocks in the respective first patterns 120a and to achieve vertically opposite arrangement of the second polymer blocks in the respective second patterns 12b.

The neutral layer 125 may include one of a self-assembled monolayer (SAM), a polymer brush, and a cross-linked random copolymer mat.

The self-assembled monolayer (SAM) may include at least one selected from the group consisting of phenethyltrichlorosilane (PETCS), phenyltrichlorosilane (PTCS), benzyltrichlorosilane (BZTCS), tolyltrichlorosilane (TTCS), 2-[(trimethoxysilyl)ethyl]-2-pyridine (PYRTMS), 4-biphenylyltrimethoxysilane (BPTMS), octadecyltrichlorosilane (OTS), 1-naphthyltrimehtoxysilane (NAPTMS), 1-[(trimethoxysilyl)methyl]naphthalene (MNATMS), and (9-methylanthracenyl)trimethoxysilane (MANTMS).

The polymer brush may have a form in which a hydrophilic polymer and a hydrophobic polymer are randomly bonded to each other. The polymer brush may be called a brush-type random copolymer. The polymer brush may be, for example, polystyrenerandom-poly(methylmethacrylate) (PS-r-PMMA).

The cross-linked random copolymer mat may be a benzocyclobutene-functionalized polystyrene-r-poly(methacrylate) copolymer including benzocyclobutene.

Referring to FIG. 11, the block copolymer material 120 may be self-assembled to the first patterns 120a and the second patterns 120b by annealing the block copolymer material 120. The annealing may include one of solvent annealing, ultraviolet annealing, and thermal annealing.

When the block copolymer material 120 is PS-b-PMMA, each of the first patterns 120 may include PS (hydrophobic) and each of the second patterns 120b may include PMMA (hydrophilic). Thus, the first patterns 120a may be disposed at a side surface of the hydrophobic mask patterns 110. A second pattern 120b may be disposed closely adjacent to the respective first patterns 120a.

The openings 112 and 114 may include the first opening 112 having substantially the same width as the unit length L0 of the block copolymer and the second opening 114 having a second width WT2 smaller than the first width WT1. As shown in FIG. 11, the total horizontal length of the first pattern 120a-the second pattern 120b-the second pattern 120b-the first pattern 120a may be substantially equal to the unit length L0 of the block copolymer (see FIG. 1). The first polymer blocks may be vertically opposite to each other in the respective first patterns 120a, and the second polymer blocks may be vertically opposite to each other in the respective second patterns 120b.

The first pattern 120a-the second pattern 120b-the second pattern 120b-the first pattern 120a may also be arranged horizontally in the first opening 112. Although the first pattern 120a-the second pattern 120b-the second pattern 120b-the first pattern 120a arranged in the first opening 112 are a single unit of a block copolymer, their total horizontal length may be smaller than the unit length L0 of the block copolymer. In this case, PS of the first pattern 120a may be shrunk as a polymer and a block copolymer corresponding to the unit length L0 of the block copolymer may be arranged even within a width smaller than the unit length L0 of the block copolymer.

As shown in FIG. 11, the second patterns 120b disposed in the first and second openings 112 and 114 having different widths WT1 and WT2 may have substantially the same width AWT.

When the surfaces of the mask patterns 110 are modified to be hydrophilic, a PS-brush layer (not shown) may be formed on the surfaces of the mask patterns 110. The step of forming the PS-brush layer has been described above and will not be described in further detail.

Figure 12:
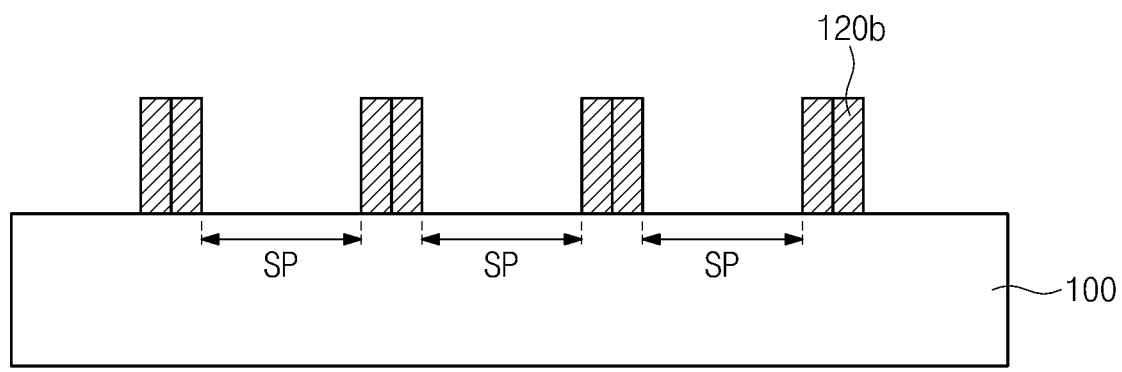

Referring to FIG. 12, the second patterns 120b may be allowed to remain by selectively removing the first patterns 120a and the mask patterns 110.

Spaced distances SP between the second patterns 120b may be substantially equal to each other. In the example embodiments, the second patterns 120b may include PDMS.

In case of PS-b-PMMA, an etch selectivity of PMMA (second pattern 120b) is higher than that of PS (first pattern 120a) and both the PS and the PMMA are organic polymers. Accordingly, it may be difficult to selectively remove only the PMMA.

However, since the PDMS includes silicon (Si), the silicon of the PDMS may be bonded to oxygen ($O_2$) to modify PDMS of the second patterns 120b into $SiO_2$ while the PS and the mask patterns 110 are removed by means of a dry etch process using the oxygen ($O_2$).

Figure 13:
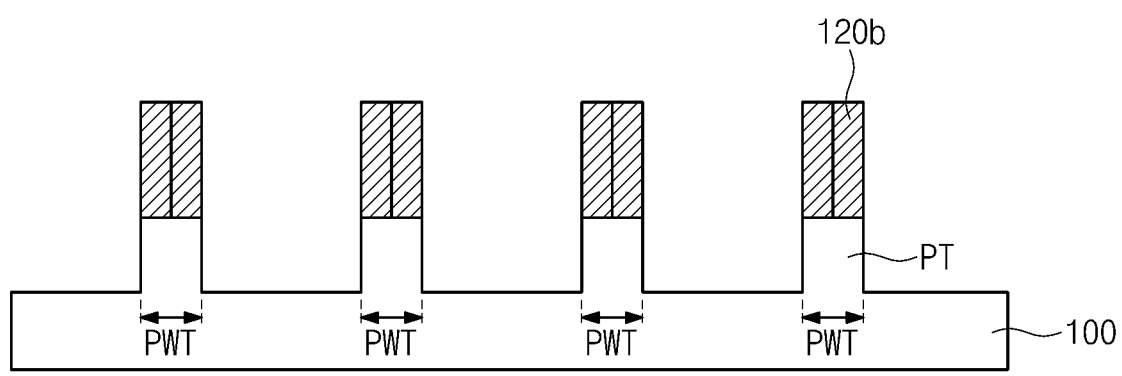

Referring to FIG. 13, the etch target layer 100 may be etched using the second patterns 120b as etch masks to fabricate a desired pattern structure.

The pattern structure may include a plurality of patterns PT, widths PWT of the patterns PT may be substantially equal to each other, and spaced distances between the patterns PT may be substantially equal to each other. In addition, width PWT of each pattern PT of the pattern structure may be smaller than the width MWT of each of the mask patterns 110 (see FIG. 9).

FIGS. 14 to 17 are cross-sectional views illustrating a method of fabricating a pattern structure according to some example embodiments of inventive concepts.

Figure 14:
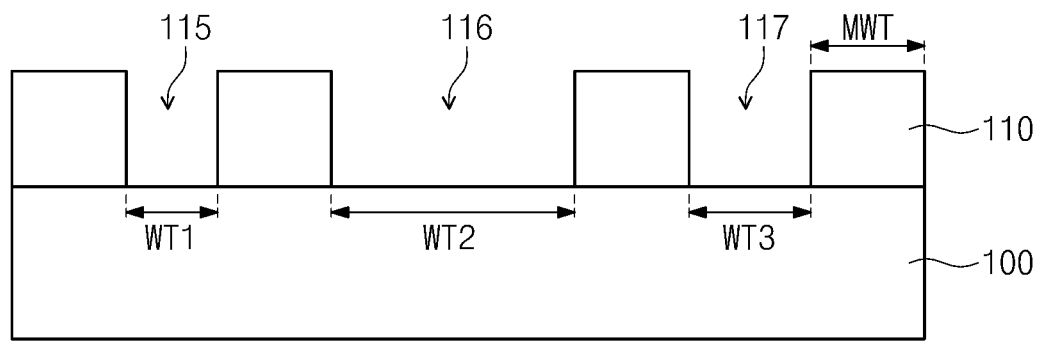
FIGS. 14 to 17 are cross-sectional views illustrating a method of fabricating a pattern structure according to some example embodiments of inventive concepts.

Referring to FIG. 14, mask patterns 110 may be formed on an etch target layer 100. The mask patterns 110 may include a plurality of openings 115, 116, and 117 to expose a top surface of the etch target layer 100.

In the example embodiments, widths MWT of the mask patterns 110 may be equal to each other but spaced distances WT1, WT2, and WT3 between the mask patterns 110 may be different from each other. That is, the openings 115, 116, and 117 may include a first opening 115 having width WT1 smaller than unit length L0 of a block copolymer, a second opening 116 having width WT2 greater than the unit length L0 of the block copolymer, and a third opening 117 having substantially the same width WT3 as the unit length L0 of the block copolymer. The second opening 116 may have a width that is double the unit length L0 of the block copolymer.

Figure 15:
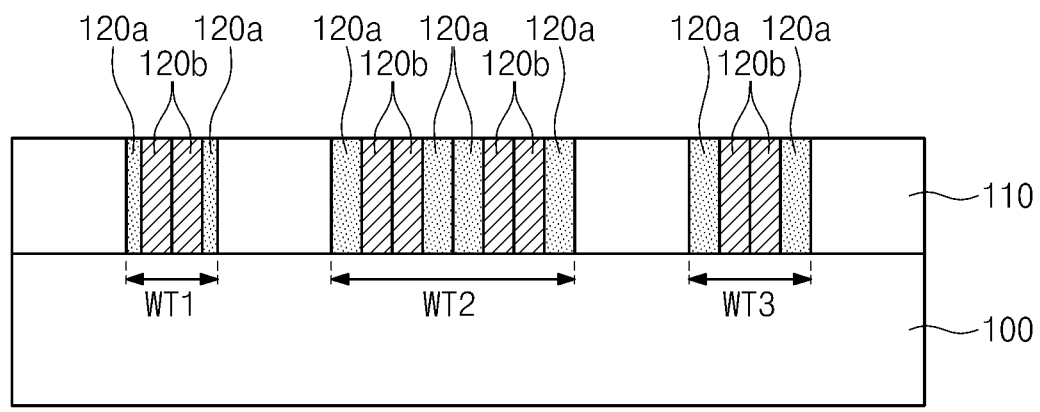

Referring to FIG. 15, after filling the openings 115, 116, and 117 with a block copolymer material 120, they may be annealed to form first patterns 120a and second patterns 120b in the respective openings 115, 116, and 117.

In some example embodiments, the block copolymer material 120 may be PS-b-PMMA. In this case, the first patterns 120a may include PS and the second patterns 120b may include PMMA.

In some example embodiments, the block copolymer material 120 may be PS-b-PDMS. In this case, the first patterns 120a may include PS and the second patterns 120b may include PDMS. Prior to the annealing, a neutral layer 125 (see FIG. 10) may be further formed.

As mentioned above, in each of the first and third openings 115 and 117, first pattern 120a-second pattern 120b-second pattern 120b-first pattern 120a corresponding to the unit length L0 of the block copolymer may be vertically opposite to be arranged horizontally. In the second opening 114, first pattern 120a-second pattern 120b-second pattern 120b-first pattern 120a corresponding to double the unit length L0 of the block copolymer may be vertically opposite to be arranged horizontally. As described in FIG. 15, the second opening 114 has a width that is double the length L0 of the block copolymer. However, some example embodiments of inventive concepts are not limited to the description.

Figure 16:
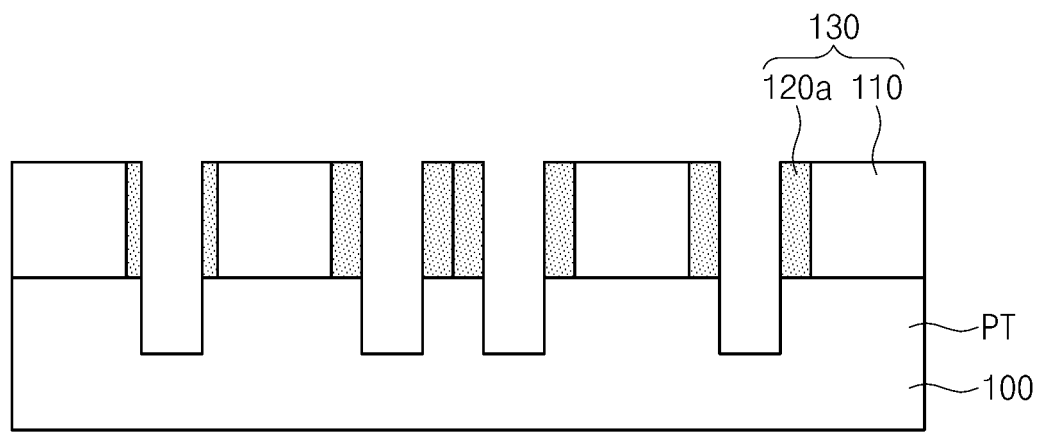

Referring to FIG. 16, when the block copolymer material 120 is PS-b-PMMA, only the second patterns 120 may be selectively removed and then the etch target layer 100 may be etched using etch patterns 130 including the first patterns 120a and the mask patterns 110 as etch masks to fabricate a pattern structure PT.

Figure 17:
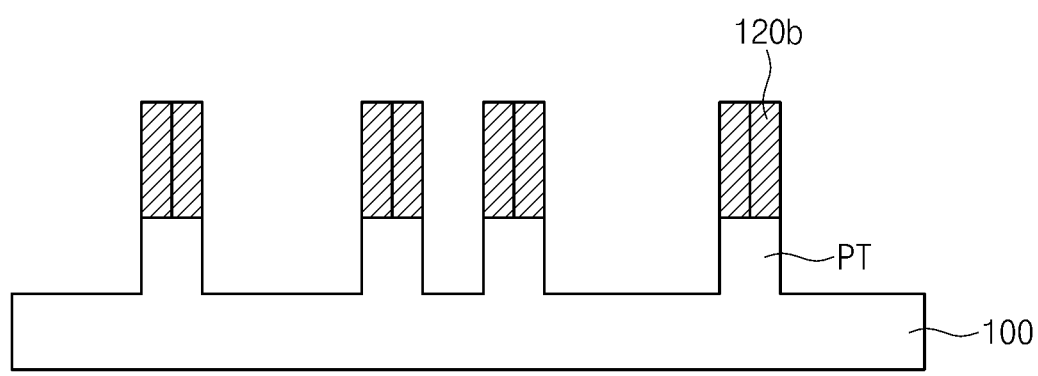

Referring to FIG. 17, when the block copolymer material 120 is PS-b-PDMS, the first patterns 120a and the mask patterns 110 may be removed and then the etch target layer 110 may be etched using the second patterns 120b as etch masks to fabricate a pattern structure PT.

The omitted explanations of the example embodiments may refer to the explanations in FIGS. 1 to 13.

FIGS. 18 to 22 are cross-sectional views illustrating a method of fabricating a pattern structure according to some example embodiments of inventive concepts.

Figure 18:
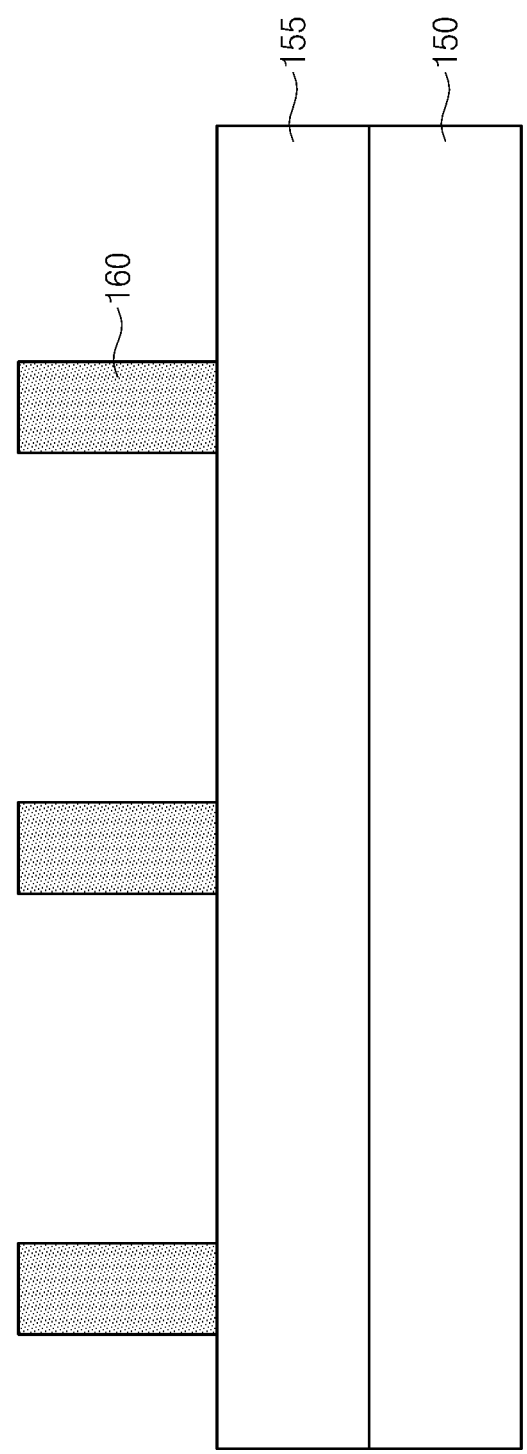
FIGS. 18 to 22 are cross-sectional views illustrating a method of fabricating a pattern structure according to some example embodiments of inventive concepts.

Referring to FIG. 18, a mask layer 155 and sacrificial patterns 160 may be sequentially formed on an etch target layer 150.

The etch target layer 150, the mask layer 155, and the sacrificial patterns 160 may include different materials. The etch target layer 150 may include a material having an etch selectivity with respect to the mask layer 155, the mask layer 155 may include an etch selectivity with respect to the etch target layer 150 and the sacrificial patterns 160, and the sacrificial patterns 160 may include a material having an etch selectivity with respect to the mask layer 155.

The etch target layer 150 may include one of a semiconductor material, a conductive material, and an insulating material or a combination thereof. In some example embodiments, if the etch target layer 150 includes the semiconductor material, the etch target layer 150 may be a semiconductor substrate or an epitaxial layer. Alternatively, the etch target layer 150 may include crystalline silicon, amorphous silicon, doped silicon, silicon germanium or a carbon-based material. In some example embodiments, if the etch target layer 100 includes the conductive material, the etch target layer 150 may include doped polysilicon, metal silicide, metal, metal nitride or a combination thereof. In some example embodiments, if the etch target layer 150 includes the insulating material, the etch target layer 150 may include silicon oxide, silicon nitride, silicon oxynitride or a low-k dielectric material.

The mask layer 155 may include one of carbon-containing SOH (C-SOH) and silicon-containing SOH (Si-SOH).

Each of the sacrificial patterns 160 may include one of a photoresist material and an SOH material. Alternatively, the sacrificial patterns 160 may include one selected from the group consisting of silicon-containing materials such as polysilicon, SiON, $Si_3N_4$, and SiCN. Each of the sacrificial patterns 160 may be a linear structure extending in one direction, and the sacrificial patterns 160 may be parallel to each other.

Figure 19:
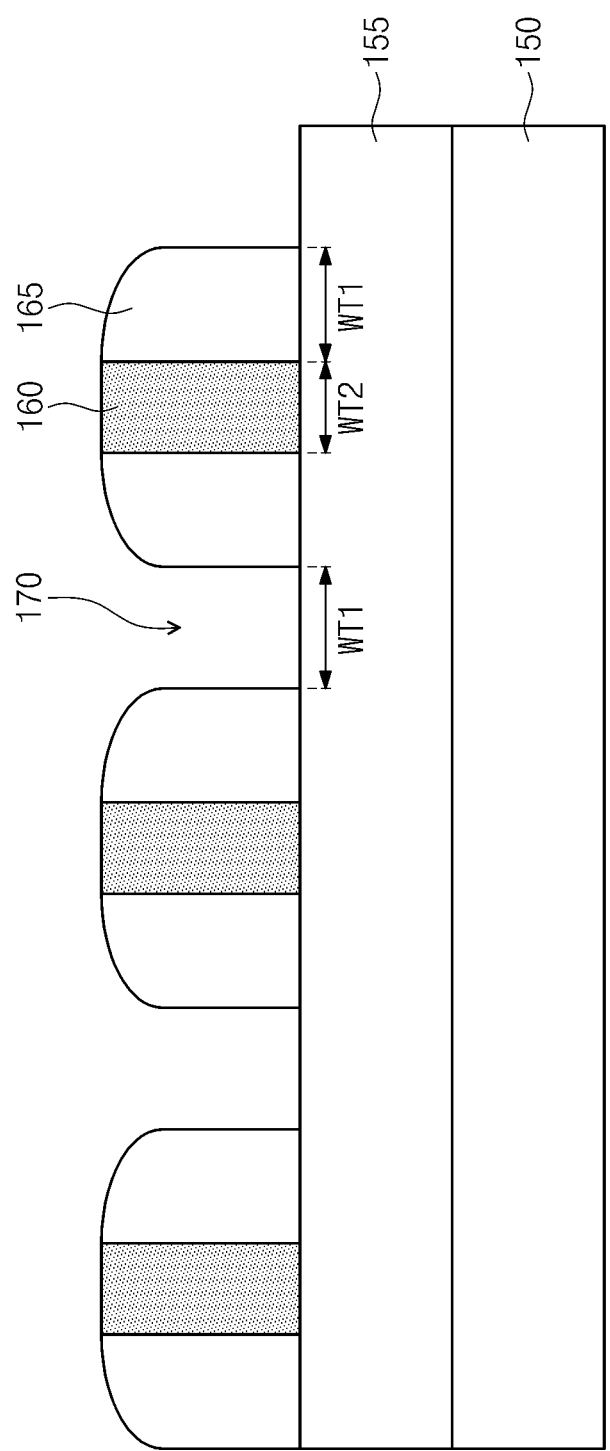

Referring to FIG. 19, spacers 165 having the same width WT1 may be formed on both sidewalls of each of the sacrificial patterns 160.

More specifically, a spacer layer (not shown) may be conformally formed on the mask layer 155 and the sacrificial patterns 160. The spacer layer may include a material having an etch selectivity with respect to the mask layer 155 and the sacrificial patterns 160. For example, the spacer layer may include at least one of silicon oxide, silicon nitride, and silicon oxynitride.

The spacer layer may be anisotropically etched to form spacers 165 having a first width WT1 on both sidewalls of each of the sacrificial patterns 160. The spacers 165 may also extend in the same direction as the sacrificial pattern 160.

In the example embodiments, the sacrificial patterns 160 and the spacers 165 must be formed to have the same width WT1. However, as a critical dimension (CD) of the sacrificial patterns 160 decreases, a width of the sacrificial pattern 160 is made smaller than the first width WT1 of the spacers 165 to decrease a distance between a single spacer 165 and an adjacent single sacrificial pattern 160, which is called "pitch waking".

Hereinafter, the critical dimension of the spacer 165 will be referred to as a first width WT1 and the critical dimension of the sacrificial pattern 160 will be referred to as a second width WT2. The second width WT2 may be smaller than the first width WT1. Width of a portion where the sacrificial pattern 160 is not formed, i.e., width of a space between spacers 165 facing each other may be substantially equal to the first width WT1. Hereinafter, the space will be referred to as a first opening 170. When the pitch walking does not occur, the spacers 165 may be spaced apart from each other by the first width WT1 by the sacrificial pattern 160 or the space.

Figure 20:
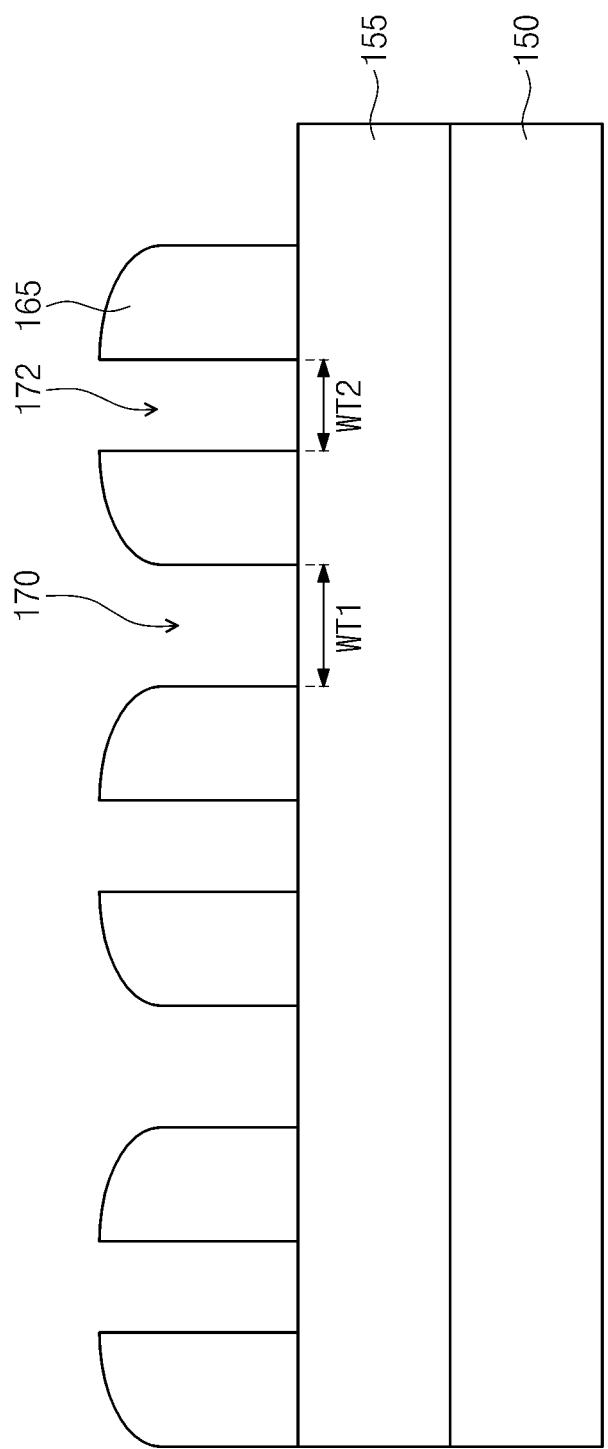

Referring to FIG. 20, the sacrificial patterns 160 may be selectively removed such that second openings 172 are formed to expose a top surface of the mask layer 155 by the second width WT2.

The first opening 170 may have the first width WT1, and the second opening 172 may have the second width WT2 smaller than the first width WT1. Thus, spaced distances between the spacers 165 may be different from each other.

Figure 21:
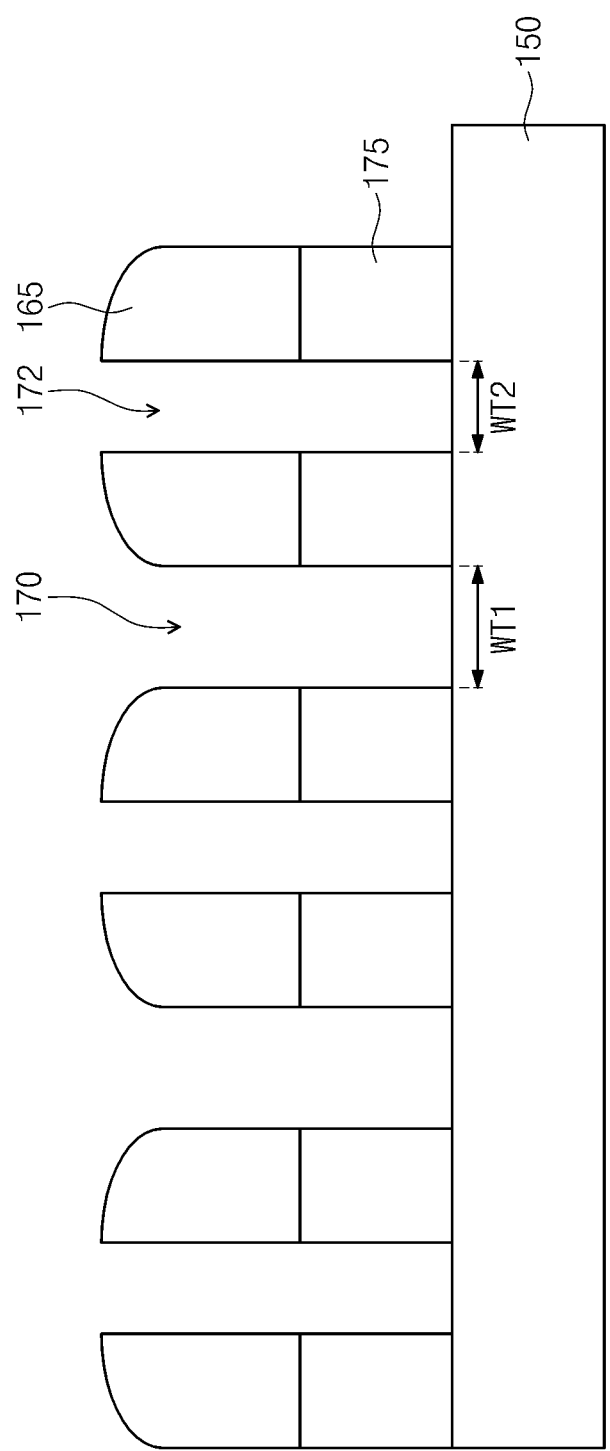

Referring to FIG. 21, the mask layer 155 may be etched using patterns of the spacer 165 as etch masks to form mask patterns 175.

The mask patterns 175 may have a structure corresponding to the patterns of the spacer 165. That is, each of the mask patterns 175 may extend in the one direction and the mask patterns 175 may be parallel to each other. Each of the mask patterns 175 may have the first width WT1. Each of the first and second openings 172 and 172 may extend to a space between the mask patterns 175.

The mask patterns 175 may include an SOH material to intrinsically have a hydrophobic property. However, the mask patterns 175 may have a hydrophilic property because an etch process of the mask layer 155 is conventionally performed as a dry etch process using oxygen and the oxygen may bonded to carbon or silicon of the mask pattern 175.

Figure 22:
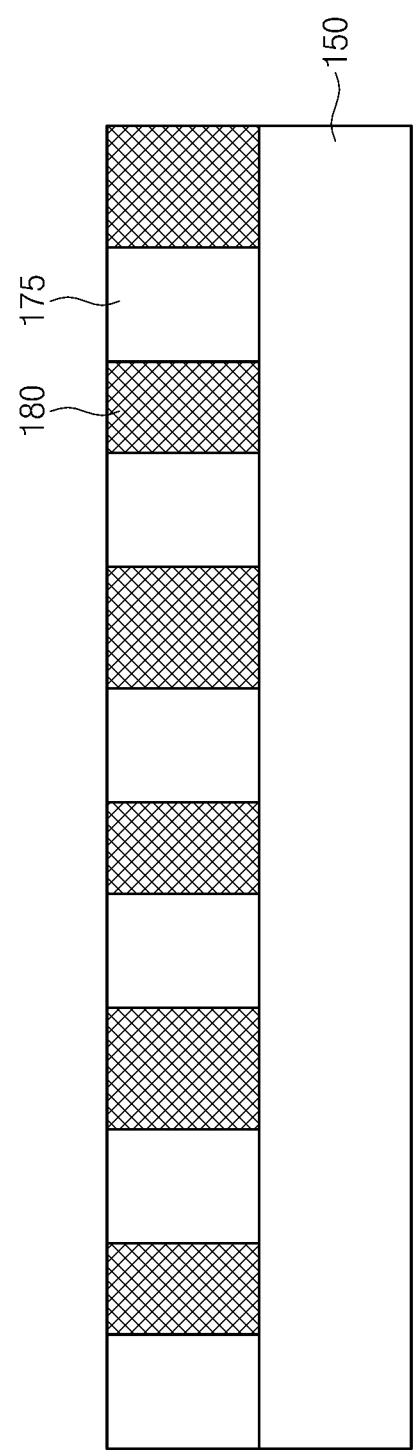

Referring to FIG. 22, after the patterns of the spacer 165 are removed, the first and second openings 112 and 114 between the mask patterns 175 may be filled with the block copolymer material 180.

In a subsequent process, a desired pattern structure may be fabricated by means of the process described with reference to FIGS. 4 to 8 or the process described with reference to FIGS. 9 to 13.

Figure 23:
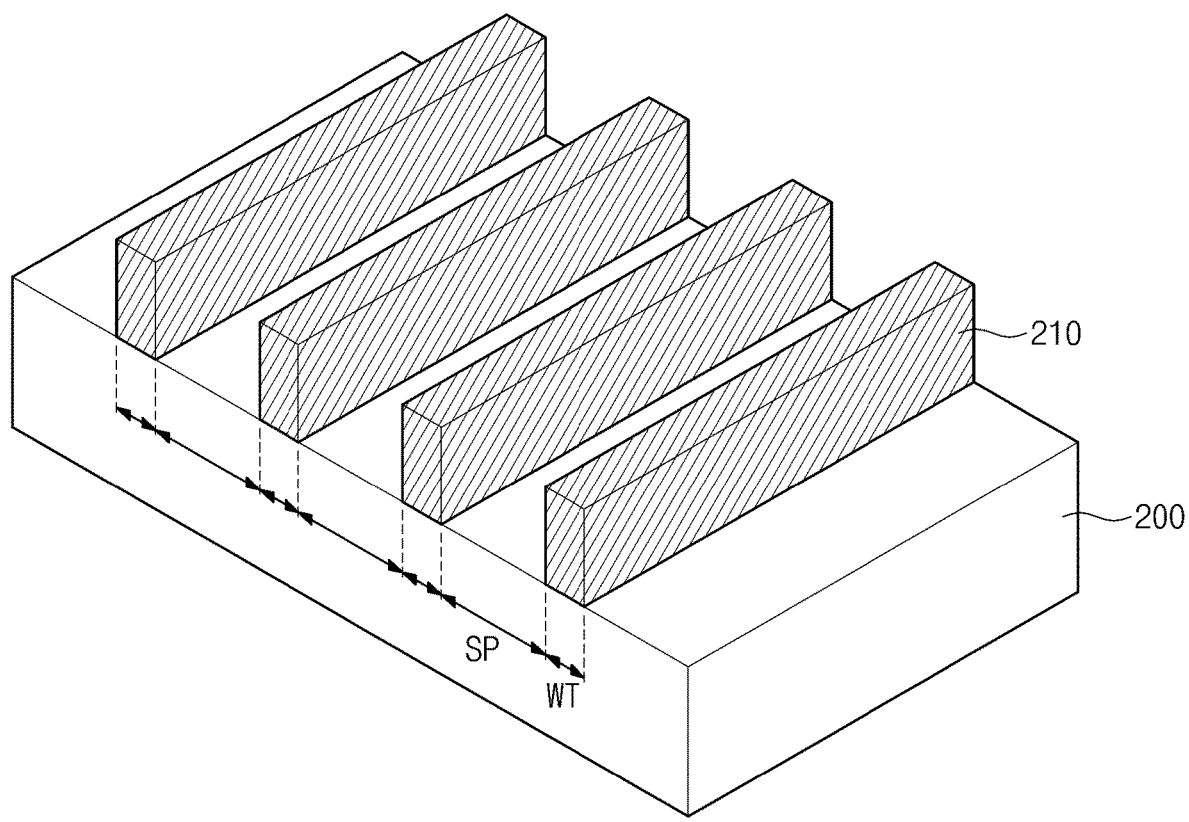
FIGS. 23 and 24 are cross-sectional views illustrating a semiconductor device according to some example embodiments of inventive concepts.
Figure 24:
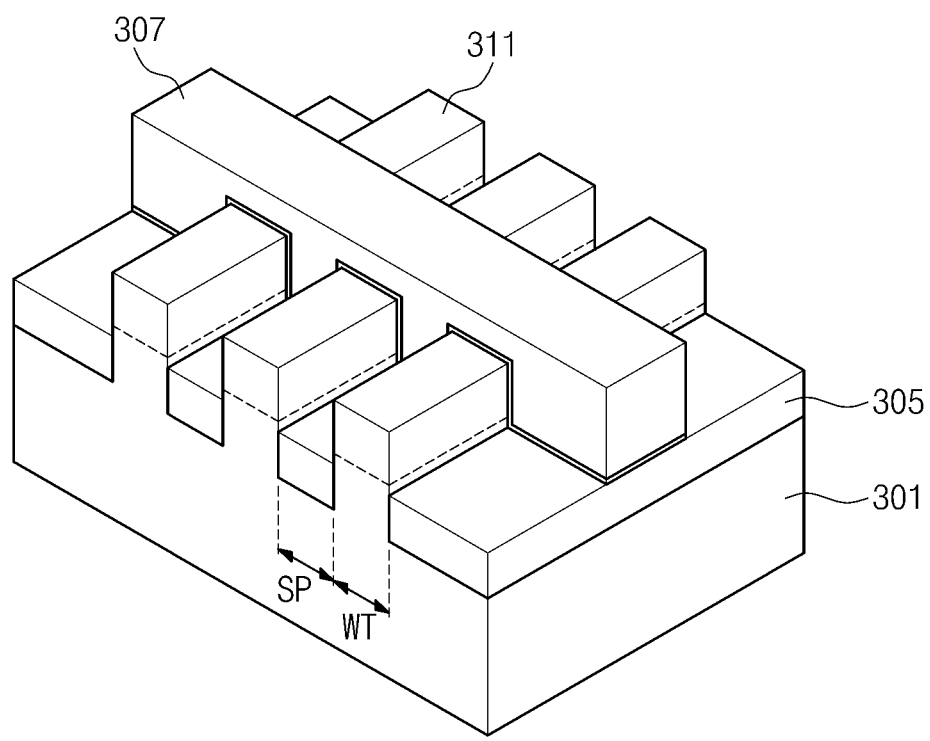

FIGS. 23 and 24 are cross-sectional views illustrating a semiconductor device according to some example embodiments of inventive concepts.

Referring to FIGS. 23 and 24, the semiconductor device may include a substrate 200/301 and a pattern structure disposed on the substrate 200/301.

The substrate 200/301 may include a cell region in which memory cells are disposed and a peripheral circuit region formed adjacent to the cell region. The peripheral region may include logic patterns for the memory cells or input/output (I/O) patterns to input/output an electrical signal to the memory cells. In the example embodiments, the pattern structure may be fabricated in the peripheral region.

The pattern structure may include patterns 210/311 of a linear structure extending in one direction. The patterns 210/311 may be parallel to each other, and the patterns 210/311 may have substantially the same width WT. In some example embodiments, spaced distances SP between the patterns 210/311 may be substantially equal to each other. In some example embodiments, the spaced distances SP between the patterns 210/311 may be different from each other. Each of the patterns 210/311 may be formed by means of the process described with reference to FIGS. 4 to 8 or the process described with reference to FIGS. 9 to 13.

In some example embodiments, the pattern structure may include a plurality of metal interconnections 210 that extend in one direction and are parallel to each other, as shown in FIG. 23.

In some example embodiments, the pattern structure may include a device isolation layer 305 to define fin active patterns 311 and a gate structure 307 intersecting the device isolation layer 305. A top surface of each of the fin active patterns 311 may be higher than that of the device isolation layer 305. In the example embodiments, the patterns may correspond to the fin active patterns 311.

Figure 25:
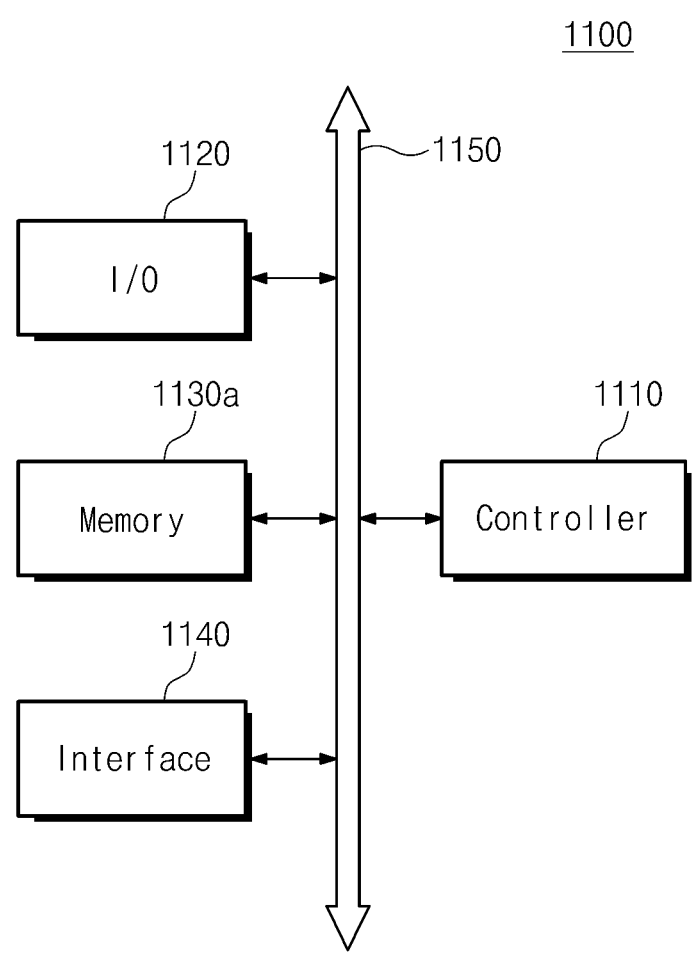
FIG. 25 is a block diagram illustrating an example of an electronic system including a semiconductor device fabricated according to some example embodiments of inventive concepts.

FIG. 25 is a block diagram illustrating an example of an electronic system including a semiconductor device fabricated according to some example embodiments of inventive concepts.

Referring to FIG. 25, an electronic system 1100 may include a controller 1110, an input/output (I/O) device 1120, a memory device 1130, an interface 1140, and a bus 1150. The controller 1100, the I/O device 1120, the memory device 1130, and/or the interface 1140 may be connected to each other via the bus 1150. The bus 1150 corresponds to a path along which data are transmitted.

The controller 1110 may include at least one of a microprocessor, a digital signal processor, a microcontroller, and logic elements capable of performing similar functions to those of a microprocessor, a digital signal processor and a microcontroller. The I/O device 1120 may include a keypad, a keyboard, and a display device. The memory device 1130 may store data and/or commands. When semiconductor devices according to the foregoing example embodiments of the inventive concepts are implemented using semiconductor memory device, the memory device 1130 may include at least one of semiconductor memory device described in the foregoing example embodiments. The interface 1140 may be used to transmit/receive data to/from a communication network. The interface 1140 may be a wired or wireless interface. In some example embodiments, the interface 1140 may include an antenna or a wired/wireless transceiver. Although not shown, the electronic system 1100 may include an operating memory for improving the operation of the controller 1110 and may further include a high-speed dynamic random access memory (DRAM) and/or SRAM.

The electronic system 1100 may be applied to all types of electronic products capable of transmitting and/or receiving information in a wireless environment, such as a personal digital assistant (PDA), a portable computer, a web tablet, a wireless phone, a mobile phone, a digital music player, and a memory card.

Figure 26:
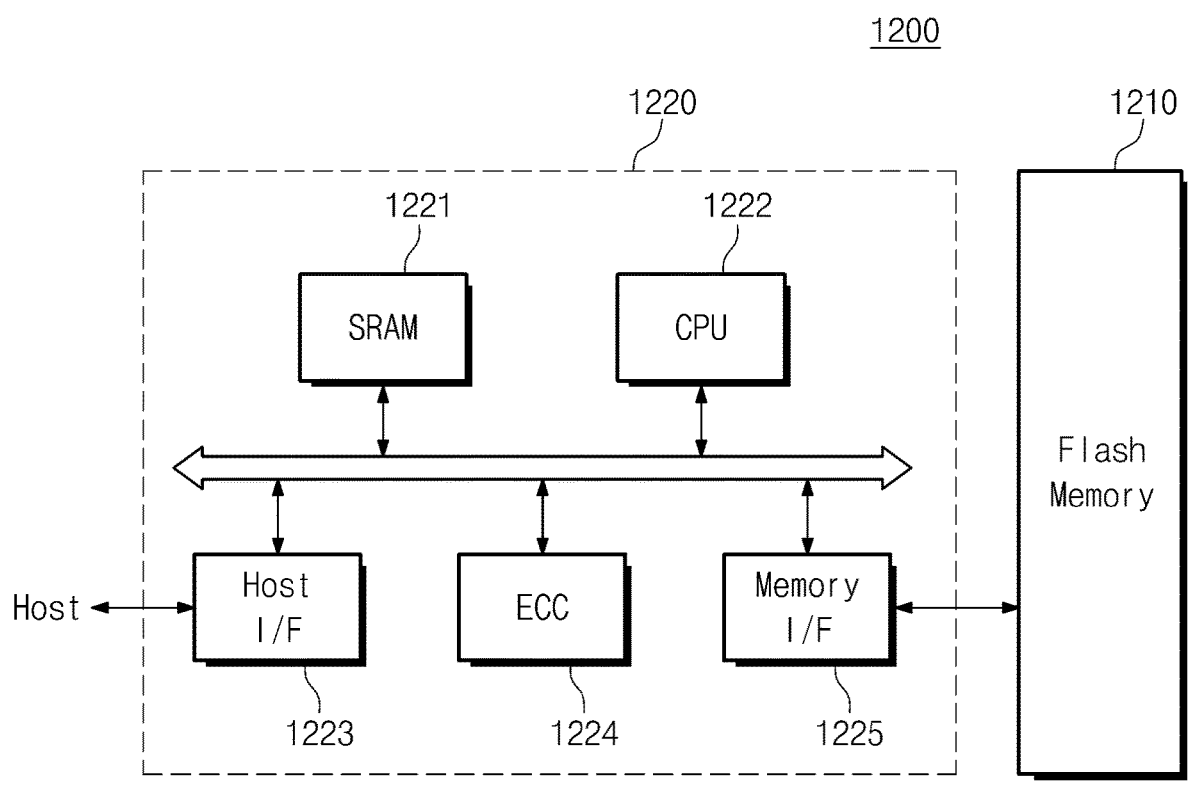
FIG. 26 is a block diagram of a memory card including a semiconductor device fabricated according to some example embodiments of inventive concepts.

FIG. 26 is a block diagram of a memory card 1200 including a semiconductor device fabricated according to some example embodiments of the inventive concepts.

Referring to FIG. 26, a memory card 1200 for supporting high-capacity data storage capability includes a memory device 1210 including a semiconductor device according to some example embodiments of the inventive concepts. The memory card 1200 includes a memory controller 1220 to control data exchange between a host and the memory device 1210.

An SRAM 1221 is used as a working memory of the processing unit 1222. A host interface 1223 may include a data exchange protocol of a host connected with the memory card 1200. An error correction code block (ECC) 1224 detects and corrects an error of data read from the memory device 1210. A memory interface 1225 interfaces with the flash memory device 1210. The processing unit 1222 performs an overall control operation for data exchange of the memory controller 1220. Although not illustrated in figures, it will be understood by those skilled in the art that the memory card 1200 may further include a ROM to store code data for interfacing with the host.

As described so far, a pattern structure including patterns having a critical dimension (CD) may be fabricated between mask patterns using a block copolymer material although it is difficult to achieve the CD using an extreme ultraviolet (EUV) or double patterning technology (DPT) process. Moreover, widths of patterns formed using properties of a block copolymer material may be substantially equal to each other. Thus, process reliability may be improved.

While the example inventive concepts have been particularly shown and described with reference to example embodiments thereof, it will be apparent to those of ordinary skill in the art that various changes in form and detail may be made therein without departing from the spirit and scope of the inventive concepts, which is defined by the following claims.

What is claimed is:
1. A method comprising:
forming a mask layer on an etch target layer;
forming a sacrificial pattern on the mask layer extending in a first direction, the sacrificial pattern having a linear structure of a first width;
forming spacers on sidewalls of the sacrificial pattern to define a first opening exposing a top surface of the mask layer, the first opening having a second width different from the first width;
removing the sacrificial pattern to form a second opening having the first width;
etching the mask layer using the spacers as etch masks to form mask patterns, the mask patterns defining a third opening having the first width and a fourth opening having the second width;
filling each of the third and fourth openings with a block copolymer material including first and second polymer blocks of different properties; and
annealing the block copolymer material to form first patterns and second patterns, the first patterns in contact with facing sidewalls of adjacent ones of the mask patterns, respectively, and at least one of the second patterns between the first patterns, the first patterns including the first polymer blocks and the second patterns including the second polymer blocks,
wherein an upper surface of at least one of the first and second patterns is flush with an upper surface of at least one of the mask patterns; and
wherein the etching the mask layer results in surface of the mask patterns to be hydrophilic, the hydrophilic surfaces of the mask patterns being hydrophobically modified.

2. The method as set forth in claim 1, wherein the forming the mask patterns is such that the third opening has a width smaller than a length of a unit of a block sequence in the block copolymer material, the block sequence including the first polymer block-the second polymer block-the second polymer block-the first polymer block, and
the fourth opening has a width substantially equal to the length of the unit of a block sequence in the block copolymer material, the block sequence including the first polymer block-the second polymer block-the second polymer block-the first polymer block.

3. The method as set forth in claim 2, wherein the first polymer block-the second polymer block-the second polymer block-the first polymer block of the block sequence are arranged sequentially from one of the facing sidewalls of the adjacent mask patterns to another of the facing sidewalls of the adjacent mask patterns in a horizontal direction.

4. The method as set forth in claim 1, wherein:
the mask patterns are hydrophobic;
each of the first patterns is hydrophobic; and
each of the second patterns is hydrophilic.

5. The method as set forth in claim 4, wherein:
the mask patterns comprise one of carbon-based spin on hardmask (C-SOH) and silicon-based SOH (Si-SOH).

6. The method as set forth in claim 1, wherein the mask patterns are hydrophobic, and the mask patterns have a hydrophilic property by etching the mask layer, the method further comprising:
hydrophobically modifying the hydrophilic surfaces of the mask patterns, when the mask patterns may have a hydrophilic property by etching the mask layer.

7. The method as set forth in claim 1, wherein:
the forming the mask patterns extends the mask patterns in the first direction, the mask patterns having widths equal to each other.

8. The method as set forth in claim 1, wherein:
the block copolymer material includes polystyrene-block-polydimethylsiloxane (PS-b-PDMS);
the second polymer block includes polystyrene (PS); and
the second polymer block includes polydimethylsiloxane (PDMS).

9. The method as set forth in claim 8, further comprising:
forming a neutral layer on the block copolymer material and the mask patterns before the annealing.

10. The method as set forth in claim 8, after forming first patterns and second patterns, further comprising:
removing the first patterns and the mask patterns; and
etching the etch target layer using the at least one second patterns as an etch mask to form a pattern structure.

11. The method as set forth in claim 1, wherein:
the block copolymer material includes polystyrene-block-polymethylmethacrylate (PS-b-PMMA);
the first polymer block includes polystyrene (PS); and
the second polymer block includes polymethylmethacrylate (PMMA).

12. The method as set forth in claim 1, after forming first patterns and second patterns, further comprising:
selectively removing the at least one of second patterns; and
etching the etch target layer using the first patterns and the mask patterns as etch masks to form a pattern structure.

13. A method comprising:
forming a block copolymer layer between adjacent mask patterns, the block copolymer layer including first polymer blocks and second polymer blocks different from the first polymer blocks;
forming a neutral layer on the block copolymer layer and the mask patterns before annealing; and
annealing the block copolymer layer in order to form first polymer block patterns and at least one second polymer block pattern, the first polymer block patterns at respective sidewalls of the adjacent mask patterns and the at least one second polymer block pattern between the first polymer block patterns, the first polymer block patterns including the first polymer blocks and the at least one second polymer block pattern including the second polymer blocks,
wherein an upper surface of at least one of the first and second polymer block patterns is flush with an upper surface of at least one of the mask patterns; and
wherein surfaces of mask patterns are hydrophobic.

14. The method as set forth in claim 13, wherein the block copolymer layer is formed in a trench between the adjacent mask patterns, the trench has a width that is smaller than or equal to a length of a unit of a block sequence of the block copolymer layers, and the block sequence includes the first polymer block-the second polymer block-the second polymer block-the first polymer block.

15. The method as set forth in claim 14, wherein the first polymer block-the second polymer block-the second polymer block-the first polymer block of the block sequence are arranged sequentially from one of the sidewalls of the adjacent mask patterns to another of the sidewalls of the adjacent mask patterns in a horizontal direction.

16. The method as set forth in claim 13, further comprising:
forming the mask patterns on an etch target layer;
selectively removing the at least one second polymer block pattern after the annealing; and
etching the etch target layer using the first polymer block patterns and the mask patterns as etch masks to form a pattern structure.

17. The method as set forth in claim 13, further comprising:
forming the mask patterns on an etch target layer;
removing the first polymer block patterns and the mask patterns after the annealing; and
etching the etch target layer using the at least one second polymer block pattern as an etch mask to form a pattern structure.

18. The method as set forth in claim 13, wherein
the adjacent mask patterns extend in one direction, and the adjacent mask patterns have widths equal to each other.

19. The method as set forth in claim 13, wherein surfaces of the mask patterns are hydrophilic, the method further comprising:
hydrophobically modifying hydrophilic surfaces of the adjacent mask patterns.

20. A method comprising:
forming mask patterns on an etch target layer;
forming a block copolymer layer between adjacent mask patterns, the block copolymer layer including first polymer blocks and second polymer blocks different from the first polymer blocks;
annealing the block copolymer layer in order to form first polymer block patterns and at least one second polymer block pattern, the first polymer block patterns at respective sidewalls of the adjacent mask patterns and the at least one second polymer block pattern between the first polymer block patterns, the first polymer block patterns including the first polymer blocks and the at least one second polymer block pattern including the second polymer blocks;
removing the first polymer block patterns and the mask patterns after the annealing; and
etching the etch target layer using the at least one second polymer block pattern as an etch mask to form a pattern structure,
wherein an upper surface of at least one of the first and second polymer block patterns is flush with an upper surface of at least one of the mask patterns; and
wherein surfaces of mask patterns are hydrophobic.

* * * * *